(12) United States Patent
Huang

(10) Patent No.: US 11,269,383 B2
(45) Date of Patent: Mar. 8, 2022

(54) ELECTRONIC DEVICE AND HINGE MODULE

(71) Applicant: PEGATRON CORPORATION, Taipei (TW)

(72) Inventor: Chao-Kai Huang, Taipei (TW)

(73) Assignee: PEGATRON CORPORATION, Taipei (TW)

( * ) Notice: Subject to any disclaimer, the term of this patent is extended or adjusted under 35 U.S.C. 154(b) by 0 days.

(21) Appl. No.: 16/917,611

(22) Filed: Jun. 30, 2020

(65) Prior Publication Data

US 2021/0041920 A1    Feb. 11, 2021

(30) Foreign Application Priority Data

Aug. 5, 2019   (TW) .................................. 108127800

(51) Int. Cl.
*H05K 7/00* (2006.01)
*G06F 1/16* (2006.01)
*H05K 7/16* (2006.01)

(52) U.S. Cl.
CPC ............. *G06F 1/1681* (2013.01); *H05K 7/16* (2013.01)

(58) Field of Classification Search
None
See application file for complete search history.

(56) References Cited

U.S. PATENT DOCUMENTS

| | | | | |
|---|---|---|---|---|
| 6,053,589 A | * | 4/2000 | Lin | G06F 1/1616 312/271 |
| 7,447,003 B2 | * | 11/2008 | Yang | G06F 1/1616 361/679.01 |
| 7,566,043 B2 | * | 7/2009 | Chen | G06F 1/1616 248/188.2 |
| 7,746,636 B2 | * | 6/2010 | Tang | G06F 1/1616 361/679.55 |
| 8,265,317 B2 | * | 9/2012 | Tseng | H04R 1/2811 381/332 |
| 8,879,251 B2 | * | 11/2014 | Hsiu | G06F 1/166 361/679.59 |
| 9,030,820 B2 | * | 5/2015 | Guo | G06F 1/1681 361/679.59 |

(Continued)

FOREIGN PATENT DOCUMENTS

TW    M473546    3/2014
TW    M539210    4/2017

*Primary Examiner* — Anthony Q Edwards
*Assistant Examiner* — Rashen E Morrison
(74) *Attorney, Agent, or Firm* — J.C. Patents

(57) ABSTRACT

An electronic device includes a base, a cover and a hinge module. The hinge module includes a hinge assembly, a support component, and an elastic component. The hinge assembly is pivoted to the base and the cover. The hinge assembly has a push portion and a rotating shaft portion. The push portion is connected to the base, and the rotating shaft portion is connected to the cover and is rotatably connected to the push portion. The support component is movably connected to the rotating shaft portion and leans against the push portion. The elastic component is connected between the rotating shaft portion and the support component. When the cover is unfolded relative to the base, the push portion pushes the support component to drive the elastic component to be extended, so that a support end of the support component protrudes from the cover.

18 Claims, 6 Drawing Sheets

(56) References Cited

U.S. PATENT DOCUMENTS

| | | | | |
|---|---|---|---|---|
| 9,354,669 B2* | 5/2016 | Chen | .................... | G06F 1/1681 |
| 9,740,253 B2* | 8/2017 | Cheng | .................... | G06F 1/1616 |
| 10,503,214 B2* | 12/2019 | Jiang | .................... | G06F 1/1681 |
| 10,627,874 B2* | 4/2020 | Lin | .................... | G06F 1/1681 |
| 2010/0315773 A1* | 12/2010 | Senatori | .................... | H05K 5/0234 |
| | | | | 361/679.55 |
| 2011/0292605 A1* | 12/2011 | Chen | .................... | G06F 1/1616 |
| | | | | 361/695 |
| 2013/0229763 A1* | 9/2013 | Guo | .................... | G06F 1/1637 |
| | | | | 361/679.27 |
| 2013/0249360 A1* | 9/2013 | Guo | .................... | G06F 1/1681 |
| | | | | 312/223.2 |
| 2013/0308268 A1* | 11/2013 | Tani | .................... | G06F 1/1679 |
| | | | | 361/679.57 |

* cited by examiner

ELECTRONIC DEVICE AND HINGE MODULE

CROSS-REFERENCE TO RELATED APPLICATION

This application claims the priority benefit of Taiwan application serial no. 108127800, filed on Aug. 5, 2019. The entirety of the above-mentioned patent application is hereby incorporated by reference herein and made a part of this specification.

BACKGROUND

Technical Field

The disclosure relates to an electronic device and a hinge module thereof, and in particular, to an electronic device and a hinge module having a support component.

Related Art

Electronic devices such as notebook computers, tablet PCs, and smartphones have been popular in the consumer market for a long time.

In the case of notebook computers, in order to allow cooling air to circulate at the bottom, some notebook computers are provided with thickened pads on the base casing, or are additionally provided with pads on the rear end of the cover casing, so that the notebook computer is supported away from the desktop when the cover is unfolded to allow cooling air to circulate at the bottom. However, the thickening or addition of the pads will affect the aesthetics of the notebook computer, and the protruding pads will affect the user's grip when holding the notebook computer and affect the storage convenience.

SUMMARY

The disclosure provides an electronic device and a hinge module, which can prevent the configuration of the support component from affecting the aesthetics, the grip, and the storage convenience of the electronic device.

An electronic device of the disclosure includes a base, a cover, and a hinge module. The hinge module includes a hinge assembly, a support component, and an elastic component. The hinge assembly is pivoted to the base and the cover. The hinge assembly has a push portion and a rotating shaft portion. The push portion is connected to the base. The rotating shaft portion is connected to the cover and is rotatably connected to the push portion. The support component is movably connected to the rotating shaft portion and leans against the push portion. The elastic component is connected between the rotating shaft portion and the support component. When the cover is unfolded relative to the base, the push portion pushes the support component and drives the elastic component to be extended, so that a support end of the support component protrudes from the cover.

A hinge module of the disclosure is adapted for an electronic device including a base and a cover. The hinge module includes a hinge assembly, a support component, and an elastic component. The hinge assembly is pivoted to the base and the cover. The hinge assembly has a push portion and a rotating shaft portion. The push portion is connected to the base. The rotating shaft portion is connected to the cover and is rotatably connected to the push portion. The support component is movably connected to the rotating shaft portion and leans against the push portion. The elastic component is connected between the rotating shaft portion and the support component. When the cover is unfolded relative to the base, the push portion pushes the support component and drives the elastic component to be extended, so that a support end of the support component protrudes from the cover.

In an embodiment of the disclosure, when the cover is folded to the base, the support component is restored by a restoring force of the elastic component, so that the support end of the support component is retracted within the cover.

In an embodiment of the disclosure, the push portion includes a first portion and a second portion. An outer diameter of the first portion is smaller than an outer diameter of the second portion. When the cover is folded to the base, the first portion of the push portion leans against the support component. When the cover is unfolded relative to the base, the second portion of the push portion leans against the support component.

In an embodiment of the disclosure, the support component is movably connected to the rotating shaft portion in a radial direction of the rotating shaft portion.

In an embodiment of the disclosure, the push portion has a slot. The slot exposes a segment of the rotating shaft portion. A connection end of the support component extends into the slot and is connected to the segment of the rotating shaft portion.

In an embodiment of the disclosure, the elastic component is located in the slot.

In an embodiment of the disclosure, the support component has a leaning surface. The leaning surface faces the slot. A width of the leaning surface is greater than a width of the slot. A portion of the leaning surface leans against the push portion.

In an embodiment of the disclosure, the support end of the support component has an inclined surface. When the cover is folded to the base, the inclined surface is flush with an outer surface of the cover.

In an embodiment of the disclosure, the hinge module includes a hinge cover. The hinge cover is connected to the cover and shields the hinge assembly, the support component, and the elastic component.

Based on the above, in the electronic device of the disclosure, the support component is designed to be pushed and moved along the periphery of the push portion of the hinge assembly, and may protrude from the cover as the cover is unfolded to support the electronic device. When the cover of the electronic device is folded to the base, the support component can be retracted within the cover to prevent the support component from affecting the aesthetics, the grip, and the storage convenience of the electronic device.

To make the aforementioned more comprehensible, several embodiments accompanied with drawings are described in detail as follows.

DETAILED DESCRIPTION OF THE EMBODIMENTS

Figure 1:
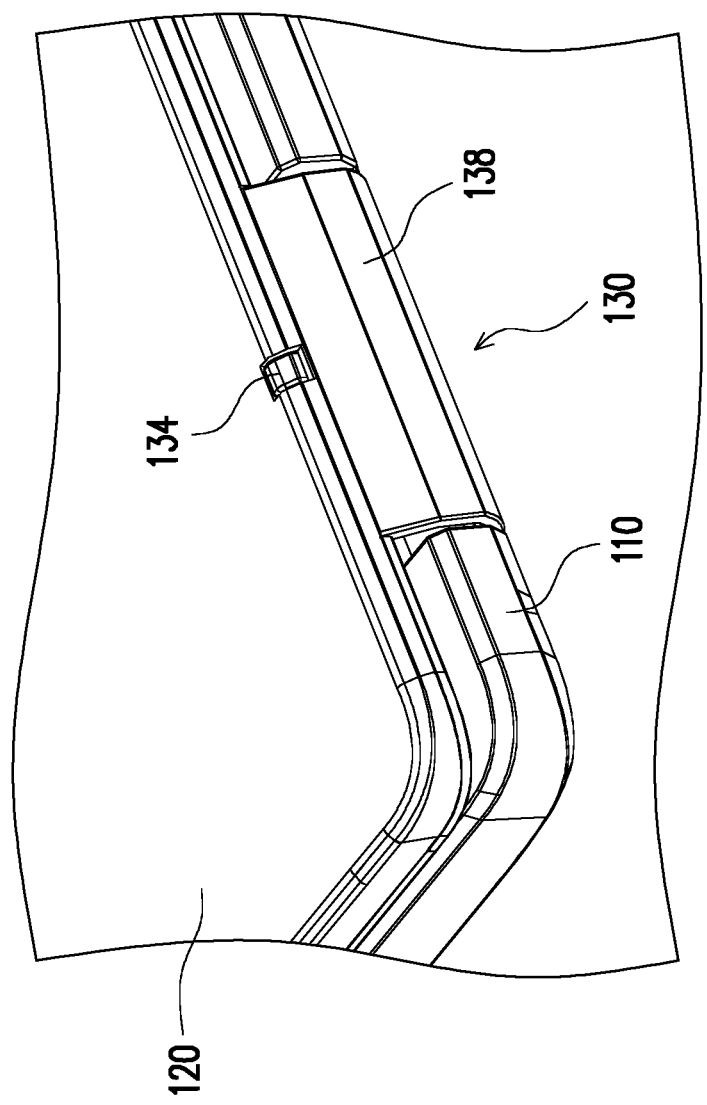
FIG. 1 is a partial perspective view showing an electronic device according to an embodiment of the disclosure.
Figure 2:
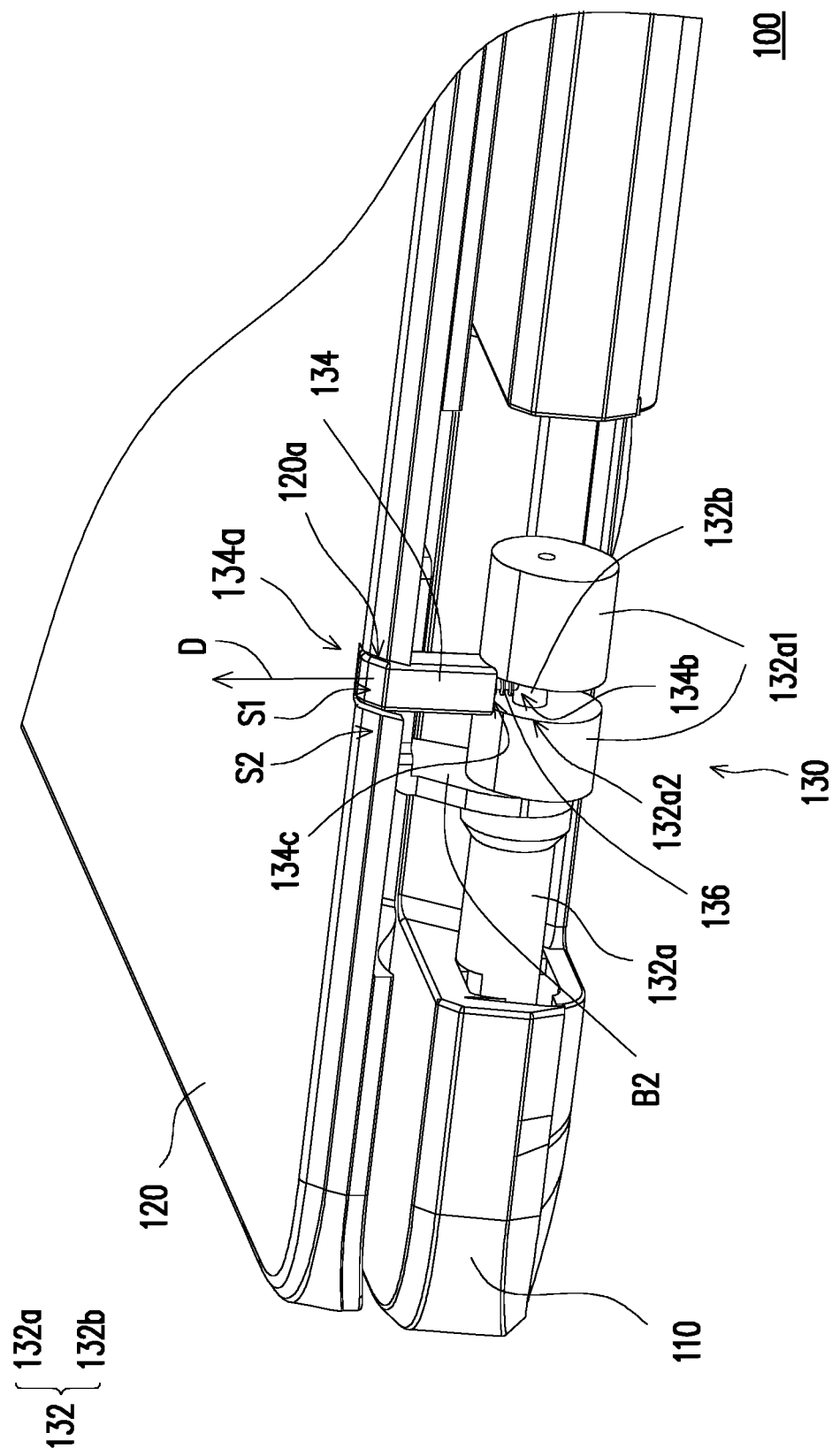
FIG. 2 is a perspective view showing part of components of the electronic device of FIG. 1.
Figure 3:
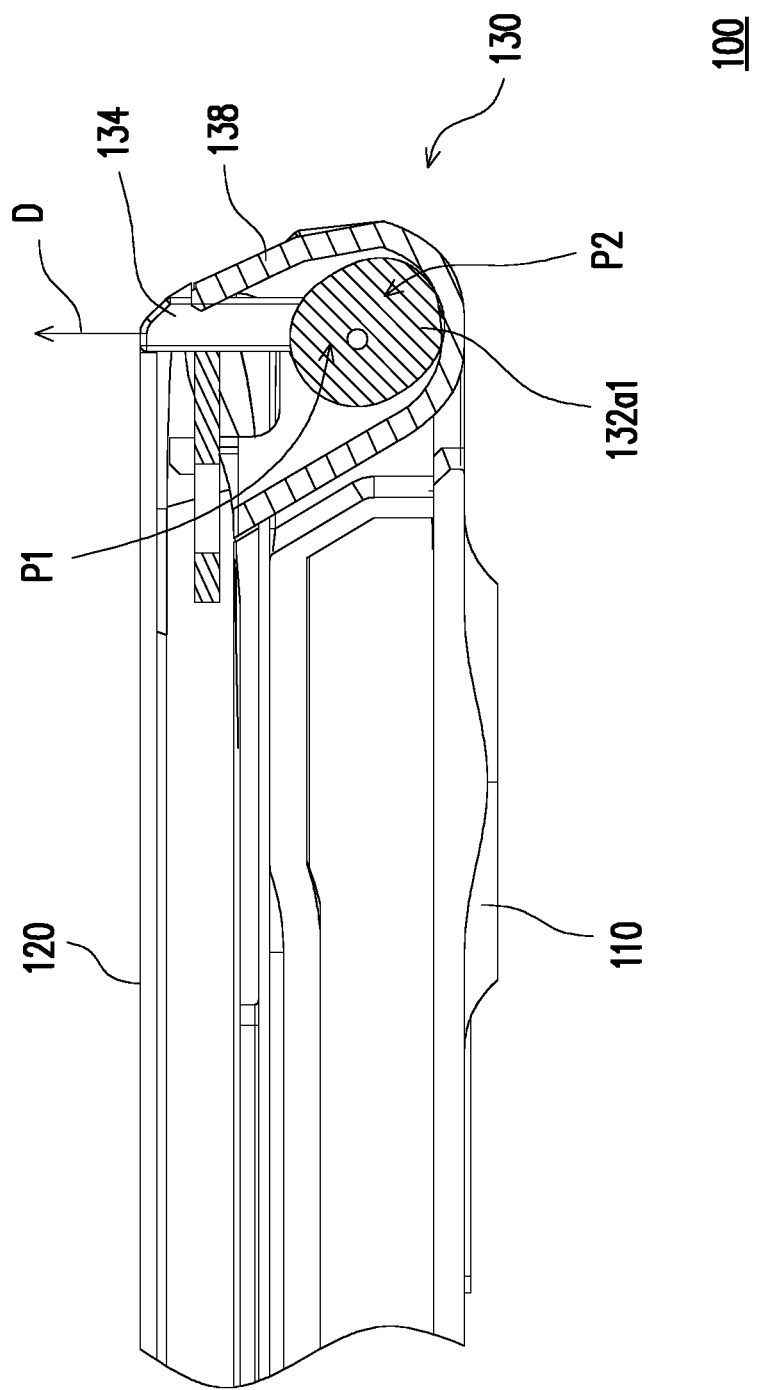
FIG. 3 is a partial sectional view showing the electronic device of FIG. 1.

FIG. 1 is a partial perspective view showing an electronic device according to an embodiment of the disclosure. FIG. 2 is a perspective view showing part of components of the electronic device of FIG. 1. FIG. 3 is a partial sectional view showing the electronic device of FIG. 1. Referring to FIG. 1 to FIG. 3, an electronic device 100 of this embodiment is, for example, a notebook computer and includes a base 110, a cover 120, and a hinge module 130. The hinge module 130 includes a hinge assembly 132, a support component 134, and an elastic component 136. The hinge assembly 132 is pivoted to the base 110 and the cover 120, and the hinge assembly 132 has a push portion 132a1. The support component 134 is movably connected to the hinge assembly 132 in a radial direction D of the hinge assembly 132 and leans against the push portion 132a1. The elastic component 136 is, for example, a spring and is connected between the hinge assembly 132 and the support component 134.

Figure 4:
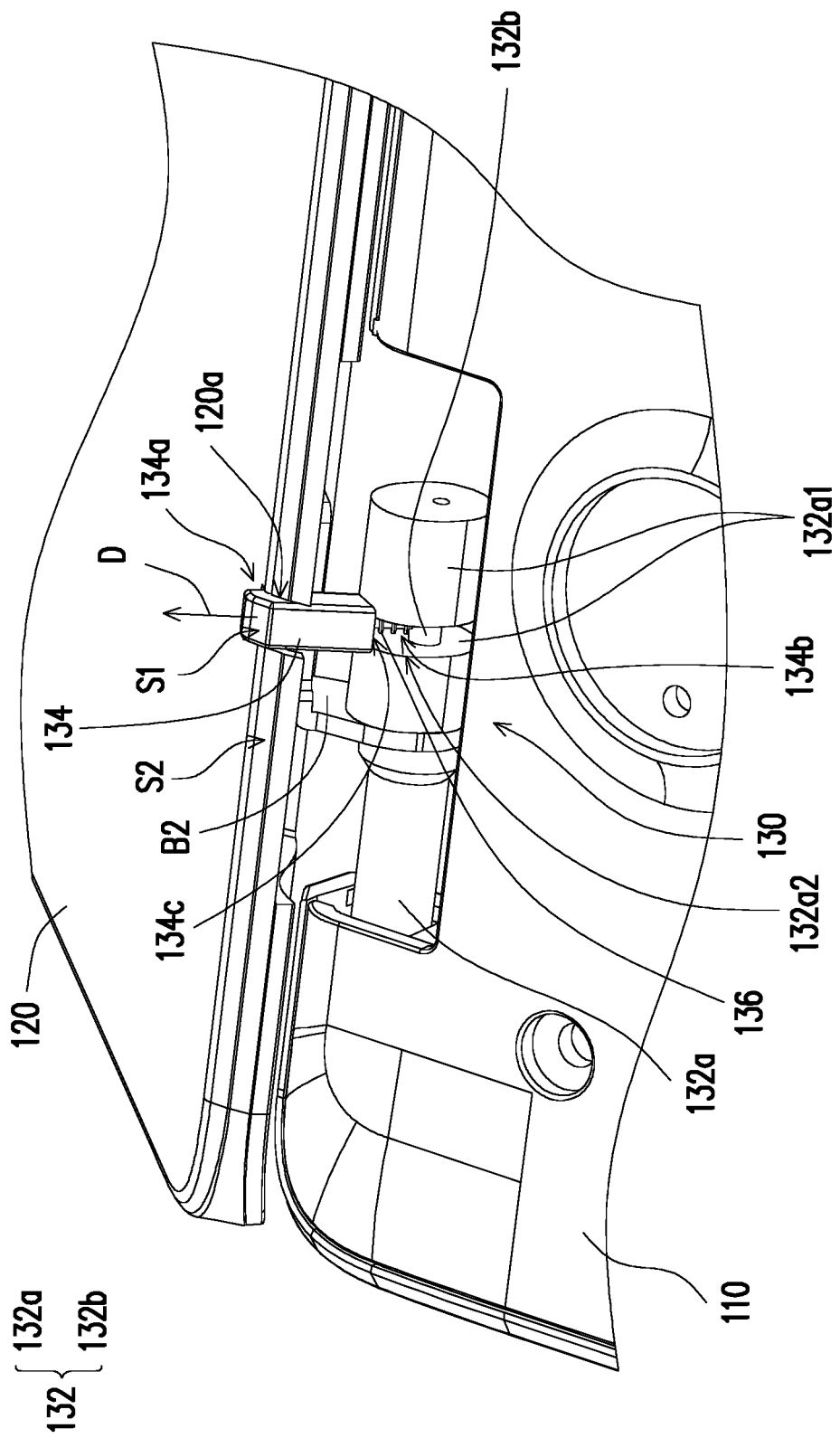
FIG. 4 shows the cover of FIG. 2 unfolding relative to the base.
Figure 5:
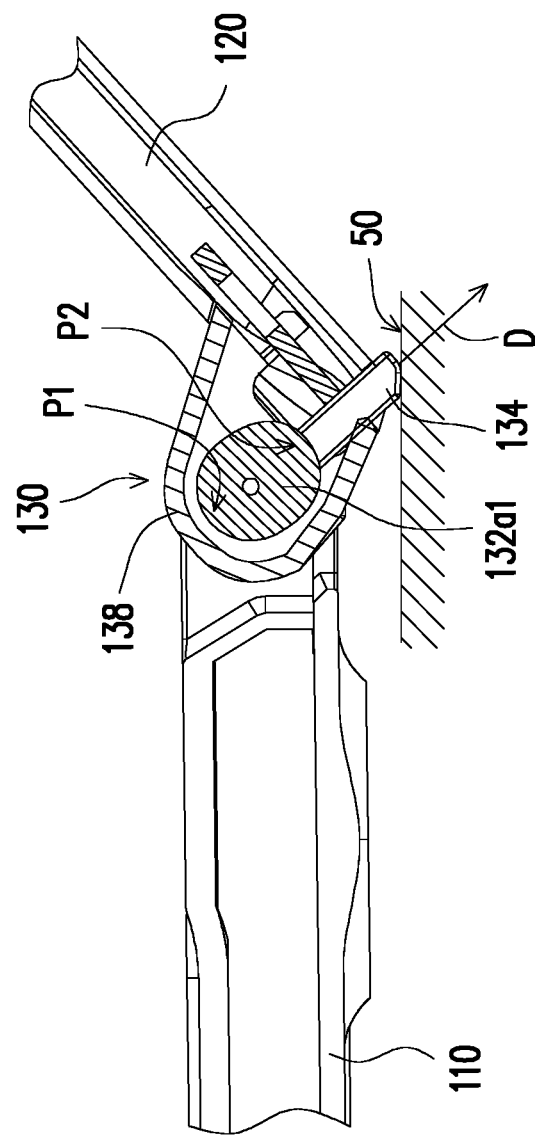
FIG. 5 shows the cover of FIG. 3 unfolding relative to the base.

FIG. 4 shows the cover of FIG. 2 unfolding relative to the base. FIG. 5 shows the cover of FIG. 3 unfolding relative to the base. When the cover 120 is unfolded relative to the base 110 as shown in FIG. 4 and FIG. 5, the push portion 132a1 pushes the support component 134 and drives the elastic component 136 to be extended, so that a support end 134a of the support component 134 protrudes from the cover 120. At this time, the support component 134 supports the base 110 and the cover 120 away from a plane 50 (e.g., a desktop) on which the electronic device 100 is placed. When the cover 120 is folded to the base 110 as shown in FIG. 2 and FIG. 3, the support component 134 is restored by the restoring force of the elastic component 136, so that the support end 134a of the support component 134 is retracted within the cover 120.

Further, the support component 134 is designed to be pushed and moved along the periphery of the push portion 132a1 of the hinge assembly 132, and may protrude from the cover 120 as the cover 120 is unfolded to support the electronic device 100. When the cover 120 of the electronic device 100 is folded to the base 110, the support component 134 can be retracted within the cover 120 to prevent the support component 134 from affecting the aesthetics, the grip, and the storage convenience of the electronic device 100.

In this embodiment, the cover 120 of the electronic device 100 has a slot 120a, and the slot 120a is configured to allow the support component 134 to pass through. The support end 134a of the support component 134 has an inclined surface S1. As shown in FIG. 2, when the cover 120 is folded to the base 110, the inclined surface S1 of the support component 134 is flush with an outer surface S2 of the cover 120 around the slot 120a, so that the electronic device 100 has a flat appearance. In other embodiments, according to the shape of the outer surface of the cover 120, the support end 134a of the support component 134 may have a corresponding appropriate shape so that the appearance of the electronic device 100 is flat.

Figure 6:
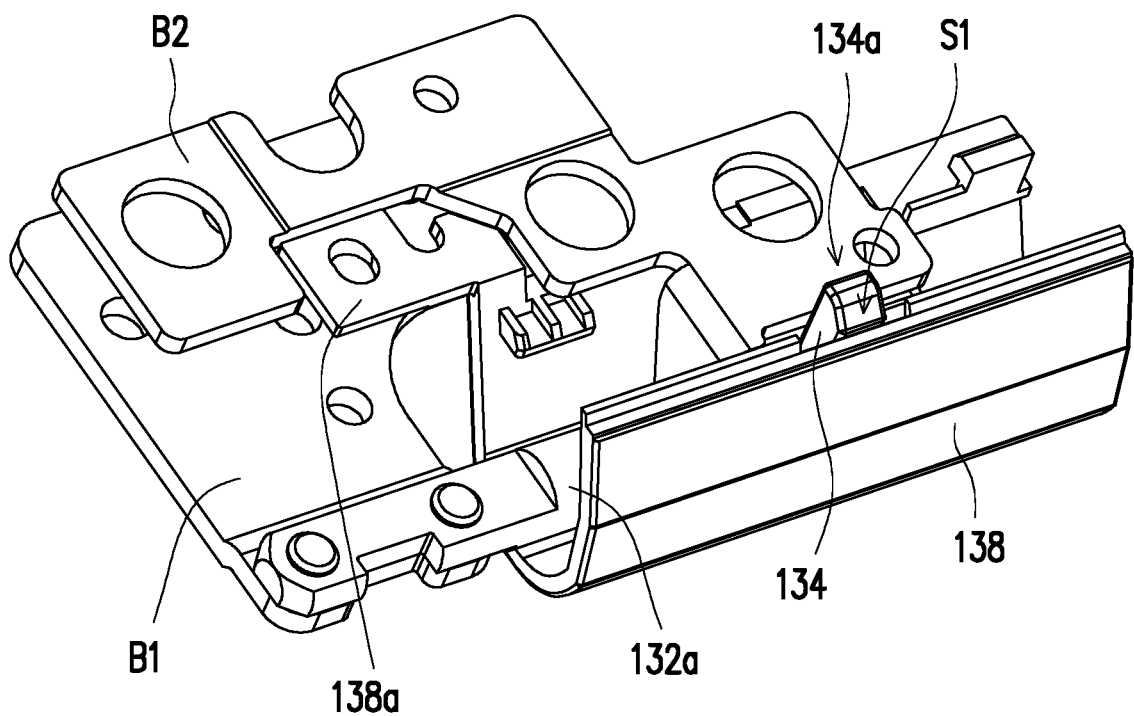
FIG. 6 is a perspective view showing part of components of the electronic device of FIG. 1.

FIG. 6 is a perspective view showing part of components of the electronic device of FIG. 1. Referring to FIG. 1 and FIG. 6, the hinge module 130 in this embodiment further includes a hinge cover 138. The hinge cover 138 is connected to the cover 120 via a connection portion 138a thereof. The hinge cover 138 is configured to shield the hinge assembly 132, the support component 134, and the elastic component 136, so that the electronic device 100 has a simple appearance.

Figure 7:
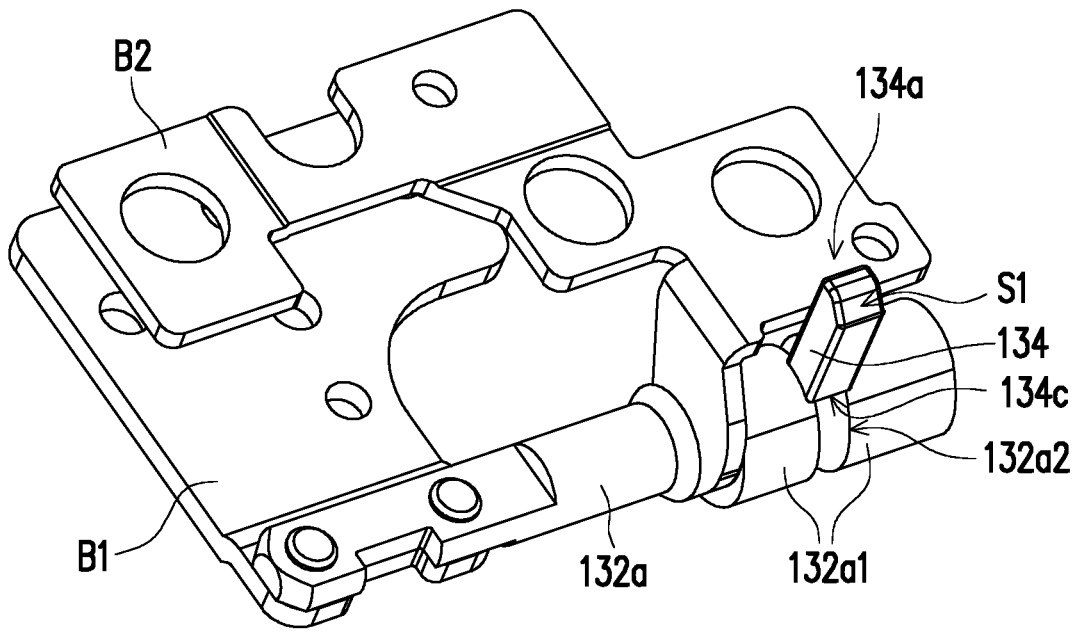
FIG. 7 is a perspective view showing part of components of the electronic device of FIG. 1.

The configurations and operations of the hinge assembly 132, the support component 134, and the elastic component 136 of this embodiment will be described in detail below. FIG. 7 is a perspective view showing part of components of the electronic device of FIG. 1. Referring to FIG. 2 and FIG. 7, the push portion 132a1 of this embodiment is a part of a fixed shaft portion 132a of the hinge assembly 132 and is connected to the base 110 via a bracket B1. The hinge assembly 132 has a rotating shaft portion 132b. The rotating shaft portion 132b is connected to the cover 120 via another bracket B2, and the rotating shaft portion 132b is pivoted to the fixed shaft portion 132a and the push portion 132a1 by passing through the inside of the fixed shaft portion 132a. The support component 134 is connected to the rotating shaft portion 132b, and the elastic component 136 is connected between the rotating shaft portion 132b and the support component 134. In addition, the push portion 132a1 includes a first portion P1 (labeled in FIG. 3 and FIG. 5) and a second portion P2 (labeled in FIG. 3 and FIG. 5). The outer diameter of the first portion P1 is smaller than the outer diameter of the second portion P2. In other words, the push portion 132a1 is a structure in the form of a cam.

When the cover 120 is folded to the base 110, the first portion P1 having a smaller outer diameter of the push portion 132a1 leans against the support component 134, so that the support component 134 is retracted within the cover 120. When the user applies a force to the cover 120 to unfold the cover 120 relative to the base 110, the cover 120 drives the rotating shaft portion 132b through the bracket B2, so that the rotating shaft portion 132b is rotated relative to the fixed shaft portion 132a, and the support component 134 is thereby rotated relative to the push portion 132a1 from the first portion P1 to the second portion P2. During this operation, since the support component 134 is moved from the first portion P1 having a smaller outer diameter to the second portion P2 having a larger outer diameter, the support component 134 protrudes from the cover 120 through the pushing of the second portion P2, as shown in FIG. 4.

In this embodiment, the push portion 132a1 has a slot 132a2. The slot 132a2 exposes a segment of the rotating shaft portion 132b. A connection end 134b of the support component 134 extends into the slot 132a2 and is movably connected to the segment of the rotating shaft portion 132b in the radial direction D. The elastic component 136 is sleeved on the connection end 134b of the support component 134 and is located in the slot 132a2. The connection end 134b of the support component 134 is, for example, slidably disposed in a hole on the segment of the rotating shaft portion 132b, or is movably connected to the segment of the rotating shaft portion 132b in other manners, and the disclosure is not limit thereto. In addition, the support component 134 of this embodiment has a leaning surface 134c. The leaning surface 134c faces the slot 132a2, and the width of the leaning surface 134c is greater than the width of the slot 132a2, so that the support component 134 can lean against the push portion 132a1 via the leaning surface 134c. Specifically, the contact area between the push portion 132a1 on one side of the slot 132a2 and the leaning surface 134c is, for example, equal to the contact area between the push portion 132a1 on the other side of the slot 132a2 and the leaning surface 134c, so that the force applied to the leaning surface 134c by the push portion 132a1 on the two sides of the slot 132a2 can be uniform.

The push portion 132a1 of this embodiment is shown as two symmetrically arranged segments which are separated by the slot 132a2 thereof. In fact, the two segments of the push portion 132a1 may be connected by an appropriate structure to form an integrated structure included by the fixed shaft portion 132a, and the disclosure does not limit the actual structural shape thereof.

In summary of the above, in the electronic device of the disclosure, the support component is designed to be pushed and moved along the periphery of the push portion of the hinge assembly, and may protrude from the cover as the cover is unfolded to support the electronic device. When the cover of the electronic device is folded to the base, the support component can be retracted within the cover to prevent the support component from affecting the aesthetics, the grip, and the storage convenience of the electronic device. In addition, the support component may have an inclined surface. In the state in which the cover is folded to the base, the inclined surface is flush with the outer surface of the cover, so that the electronic device has a flat appearance.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An electronic device comprising:
    a base;
    a cover; and
    a hinge module comprising:
       a hinge assembly pivoted to the base and the cover, wherein the hinge assembly has a push portion and a rotating shaft portion, the push portion is connected to the base, and the rotating shaft portion is connected to the cover and is rotatably connected to the push portion;
       a support component movably connected to the rotating shaft portion and leaning against the push portion; and
       an elastic component connected between the rotating shaft portion and the support component, wherein when the cover is unfolded relative to the base, the push portion pushes the support component and drives the elastic component to be extended, so that a support end of the support component protrudes from the cover.

2. The electronic device according to claim 1, wherein when the cover is folded to the base, the support component is restored by a restoring force of the elastic component, so that the support end of the support component is retracted within the cover.

3. The electronic device according to claim 1, wherein the push portion comprises a first portion and a second portion, and an outer diameter of the first portion is smaller than an outer diameter of the second portion, wherein when the cover is folded to the base, the first portion of the push portion leans against the support component, and when the cover is unfolded relative to the base, the second portion of the push portion leans against the support component.

4. The electronic device according to claim 1, wherein the support component is movably connected to the rotating shaft portion in a radial direction of the rotating shaft portion.

5. The electronic device according to claim 1, wherein the push portion has a slot, the slot exposes a segment of the rotating shaft portion, and a connection end of the support component extends into the slot and is connected to the segment of the rotating shaft portion.

6. The electronic device according to claim 5, wherein the elastic component is located in the slot.

7. The electronic device according to claim 5, wherein the support component has a leaning surface, the leaning surface faces the slot, a width of the leaning surface is greater than a width of the slot, and a portion of the leaning surface leans against the push portion.

8. The electronic device according to claim 1, wherein the support end of the support component has an inclined surface, and when the cover is folded to the base, the inclined surface is flush with an outer surface of the cover.

9. The electronic device according to claim 1, wherein the hinge module comprises a hinge cover and the hinge cover is connected to the cover and shields the hinge assembly, the support component, and the elastic component.

10. A hinge module, adapted for an electronic device comprising a base and a cover, the hinge module comprising:
    a hinge assembly pivoted to the base and the cover, wherein the hinge assembly has a push portion and a rotating shaft portion, the push portion is connected to the base, and the rotating shaft portion is connected to the cover and is rotatably connected to the push portion;
    a support component movably connected to the rotating shaft portion and leaning against the push portion; and
    an elastic component connected between the rotating shaft portion and the support component, wherein when the cover is unfolded relative to the base, the push portion pushes the support component and drives the elastic component to be extended, so that a support end of the support component protrudes from the cover.

11. The hinge module according to claim 10, wherein when the cover is folded to the base, the support component is restored by a restoring force of the elastic component, so that the support end of the support component is retracted within the cover.

12. The hinge module according to claim 10, wherein the push portion comprises a first portion and a second portion, and an outer diameter of the first portion is smaller than an outer diameter of the second portion, wherein when the cover is folded to the base, the first portion of the push portion leans against the support component, and when the cover is unfolded relative to the base, the second portion of the push portion leans against the support component.

13. The hinge module according to claim 10, wherein the support component is movably connected to the rotating shaft portion in a radial direction of the rotating shaft portion.

14. The hinge module according to claim 10, wherein the push portion has a slot, the slot exposes a segment of the rotating shaft portion, and a connection end of the support component extends into the slot and is connected to the segment of the rotating shaft portion.

15. The hinge module according to claim 14, wherein the elastic component is located in the slot.

16. The hinge module according to claim 14, wherein the support component has a leaning surface, the leaning surface faces the slot, a width of the leaning surface is greater than a width of the slot, and a portion of the leaning surface leans against the push portion.

17. The hinge module according to claim 10, wherein the support end of the support component has an inclined surface, and when the cover is folded to the base, the inclined surface is flush with an outer surface of the cover.

18. The hinge module according to claim 10, comprising a hinge cover, wherein the hinge cover is connected to the cover and shields the hinge assembly, the support component, and the elastic component.

\* \* \* \* \*